US011469080B1

(12) United States Patent
Huderi Somanna et al.

(10) Patent No.: US 11,469,080 B1
(45) Date of Patent: Oct. 11, 2022

(54) MAGNETRON ASSEMBLY HAVING COOLANT GUIDE FOR ENHANCED TARGET COOLING

(71) Applicant: Applied Materials, Inc., Santa Clara, CA (US)

(72) Inventors: Dinkesh Huderi Somanna, San Jose, CA (US); Brian T. West, San Jose, CA (US); Jeonghoon Oh, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/328,855

(22) Filed: May 24, 2021

(51) Int. Cl.
*H01J 37/34* (2006.01)
*H01J 37/32* (2006.01)
*C23C 14/35* (2006.01)
*C23C 14/50* (2006.01)
*H05K 7/20* (2006.01)

(52) U.S. Cl.
CPC ........ *H01J 37/32522* (2013.01); *C23C 14/35* (2013.01); *C23C 14/50* (2013.01); *H01J 37/3405* (2013.01); *H01J 37/3435* (2013.01); *H05K 7/20263* (2013.01); *H01J 2237/002* (2013.01)

(58) Field of Classification Search
CPC .. H01J 37/345; H01J 37/3452; H01J 37/3455; H01J 37/3461; H01J 37/32522; H01J 37/3405; H01J 37/3435; H01J 2237/002; H05K 7/20263; C23C 14/50; C23C 14/35

USPC ............................ 204/298.09, 298.2, 298.19
See application file for complete search history.

(56) References Cited

U.S. PATENT DOCUMENTS

| 8,795,487 | B2 | 8/2014 | Ritchie et al. | |
| 11,024,490 | B2 | 6/2021 | Faune et al. | |
| 2015/0048735 | A1* | 2/2015 | West | H01J 37/3405 |
| | | | | 315/39.71 |
| 2019/0019658 | A1 | 1/2019 | Wysok et al. | |

FOREIGN PATENT DOCUMENTS

| JP | 2003-089872 | * 3/2003 |
| JP | 2003-185240 | * 7/2003 |

* cited by examiner

*Primary Examiner* — Rodney G McDonald
(74) *Attorney, Agent, or Firm* — Moser Taboada

(57) ABSTRACT

Embodiments of coolant guides for use in magnetron assemblies are provided herein. In some embodiments, a coolant guide for use in a magnetron assembly includes: a body having a guide channel extending through the body, wherein an upper opening of the guide channel corresponding with an upper surface of the body has a first size and a lower opening of the guide channel corresponding with a lower surface of the body has a second size greater than the first size, and wherein the body includes a first pair of outer sidewalls that are substantially parallel to each other and a second pair of outer sidewalls that are angled toward each other; and an upper lip extending away from an upper surface of the body.

20 Claims, 6 Drawing Sheets

MAGNETRON ASSEMBLY HAVING COOLANT GUIDE FOR ENHANCED TARGET COOLING

FIELD

Embodiments of the present disclosure generally relate to substrate processing equipment, and more specifically, to magnetron assemblies for use with substrate processing equipment.

BACKGROUND

In the fabrication of semiconductor integrated circuits, sputtering, alternatively called physical vapor deposition (PVD), is used to deposit layers of material. Use of PVD has been extended to depositing layers of material onto the sidewalls of high aspect-ratio holes such as vias or other vertical interconnect structures. Currently, advanced sputtering applications include depositing materials having high stress and high ion density into such vias.

For example, titanium, tantalum, and the like have been used in through silicon via (TSV) applications. The inventors have observed that in such applications and other applications using other target materials where a high stress target material and, thus, high power, are utilized, the target begins to crack and bow due to high target temperatures and insufficient cooling. Although a coolant has been used to cool the backside of the target assembly, the inventors have observed that the coolant flowing into the cavity in which the magnetron is disposed does not sufficiently cool the target in certain applications.

Accordingly, the inventors have provided improved magnetron assemblies.

SUMMARY

Embodiments of coolant guides for use in magnetron assemblies are provided herein. In some embodiments, a coolant guide for use in a magnetron assembly includes: a body having a guide channel extending through the body, wherein an upper opening of the guide channel corresponding with an upper surface of the body has a first size and a lower opening of the guide channel corresponding with a lower surface of the body has a second size greater than the first size, and wherein the body includes a first pair of outer sidewalls that are substantially parallel to each other and a second pair of outer sidewalls that are angled toward each other; and an upper lip extending away from an upper surface of the body.

In some embodiments, a magnetron assembly includes: a plurality of magnets spaced apart from each other; an inner plate coupled to a first end of each of the plurality of magnets and having one or more coolant holes extending therethrough; an outer ring disposed about the inner plate and coupled to a second end of each of the plurality of magnets; an upper plate disposed above the inner plate and coupled to the inner plate and the plurality of magnets, wherein the upper plate includes a coolant feed opening; and a coolant guide disposed between the inner plate and the upper plate and having a guide channel aligned with the coolant feed opening and the one or more coolant holes to facilitate guiding a coolant from the coolant feed opening into the one or more coolant holes.

In some embodiments, a process chamber includes: a chamber body having an interior volume therein; a lid removably disposed atop the chamber body; a target comprising a material to be sputtered coupled to the lid, wherein the target and the lid define a cavity therebetween; a substrate support disposed within the chamber body opposite the target to support a substrate; and a magnetron assembly disposed on a side of the target opposite the substrate support comprising: a rotatable magnet assembly having a plurality of magnets spaced apart from each other and disposed about a central axis of the magnetron assembly, wherein the plurality of magnets are coupled to an upper plate, an inner plate, and an outer ring; and a coolant guide disposed between the inner plate and the upper plate radially inward of the plurality of magnets and having a guide channel aligned with a coolant feed opening in the upper plate and one or more coolant holes in the inner plate to facilitate guiding a coolant from the coolant feed opening to the one or more coolant holes.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
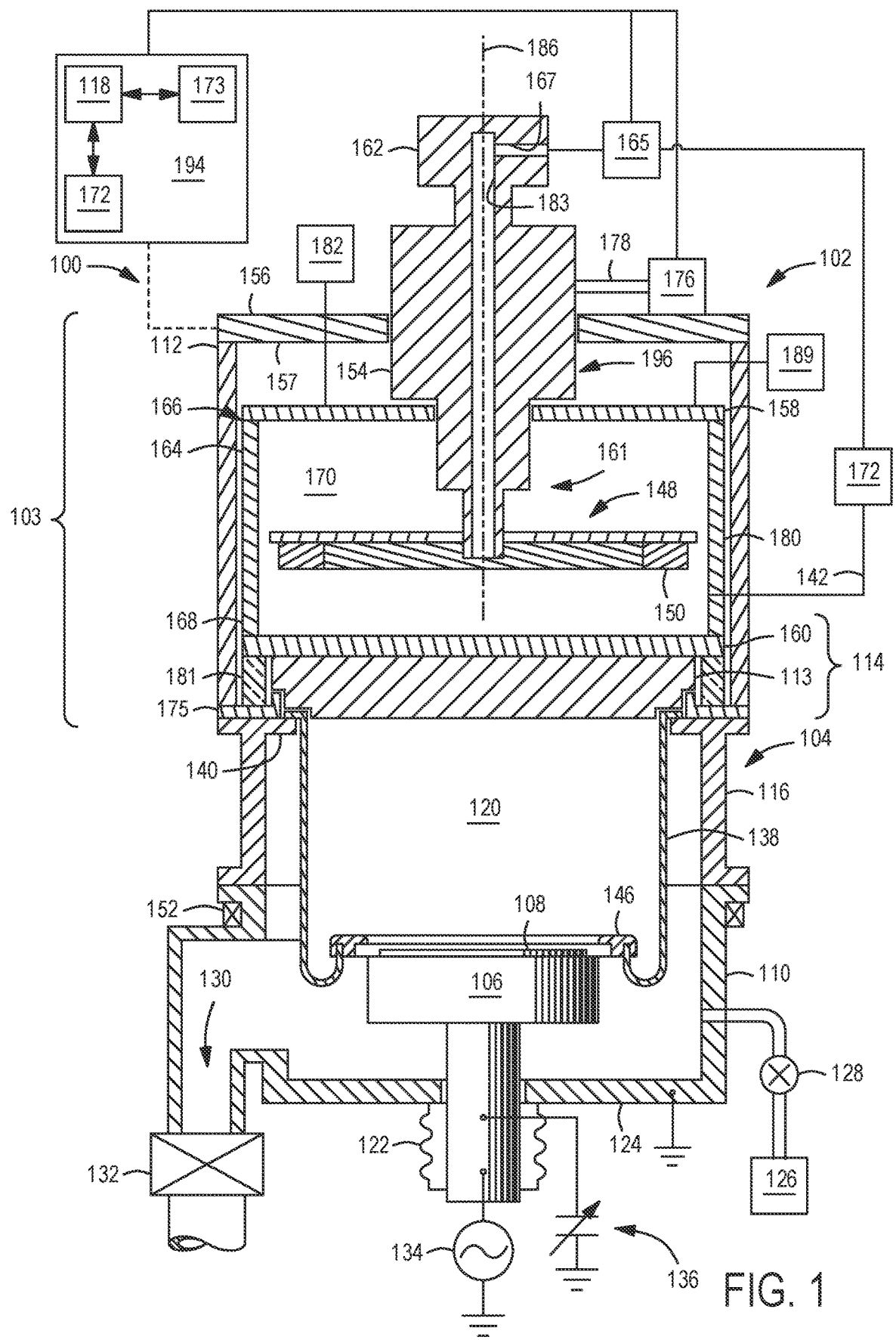
FIG. 1 depicts a schematic cross-sectional view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to a magnetron assembly having a centrally fed coolant channel and a coolant guide to force coolant across a backside of a target assembly. The inventive magnetron advantageously alleviates failure of the target due to overheating. When the magnetron assembly spins, the centrally fed coolant may splash around within the magnetron assembly and be forced towards sidewalls of cavity on a backside of the target assembly instead of the backside of the target assembly. The inventive coolant guide provides enhanced coolant flow for proper target cooling. The coolant guide is generally disposed in a space between the magnets of the magnetron assembly and is configured to direct coolant below the magnetron assembly, advantageously improving cooling of the target assembly disposed beneath the magnetron assembly.

FIG. 1 depicts a schematic cross-sectional view of a process chamber (e.g., physical vapor deposition (PVD) process chamber 100) in accordance with at least some embodiments of the present disclosure. Other processing chambers, including those configured for other types of processing besides PVD, may also benefit from modifications in accordance with the teachings disclosed herein.

For illustration, the PVD process chamber 100 includes a chamber lid 102 removably disposed atop a chamber body 104. The chamber body 104 may define an interior volume 115 therein. The chamber lid 102 may include a target assembly 114 and a grounding assembly 103. A substrate support 106 is disposed in the interior volume 115 opposite the target assembly 114 for receiving a substrate 108. The substrate support 106 may be located within a lower grounded enclosure wall 110, which may be part of a chamber wall of the chamber body 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively, or in combination, a DC power source may be similarly coupled to target assembly 114.

The PVD process chamber 100 may include a source distribution plate 158 opposing a backside of the target assembly 114 and electrically coupled to the target assembly 114 along a peripheral edge of the target assembly 114. The PVD process chamber 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate 160). The magnetron assembly 196 is disposed on a side of the target assembly 114 opposite the substrate support 106.

The magnetron assembly 196 provides a rotating magnetic field proximate the target to assist in plasma processing within the chamber body 104. The magnetron assembly 196 includes a feedthrough assembly 154, a motor 176 coupled to the feedthrough assembly 154 via a coupling assembly 178 (e.g., a gear assembly), and a rotatable magnet assembly 148 coupled to a lower portion of the feedthrough assembly 154 and disposed within the cavity 170. The rotatable magnet assembly 148 includes a plurality of magnets 150. The motor 176 and coupling assembly 178 are configured to rotate the feedthrough assembly 154, the rotatable magnet assembly 148 and the plurality of magnets 150 about a central axis 186 of the chamber body 104. The motor 176 may be an electric motor, a pneumatic or hydraulic drive, or any other process-compatible mechanism that can provide the required movement. While one illustrative embodiment is described herein to illustrate how the rotatable magnet assembly 148 may be rotated, other configurations may also be used.

The feedthrough assembly 154 includes a coolant feedthrough channel 183 to provide a coolant along the central axis 186 to an area beneath the feedthrough assembly 154. The coolant feedthrough channel 183 extends through the feedthrough assembly 154 along the central axis 186. The coolant feedthrough channel 183 extends along the central axis 186 from a manifold portion 162 through a lower portion 161 of the feedthrough assembly 154. A coolant supply 165 is fluidly coupled to an inlet 167 of the manifold portion 162 to supply a coolant through the coolant feedthrough channel 183 and into the cavity 170 to an area beneath the rotatable magnet assembly 148. The coolant may be water, such as distilled water, or any other suitable coolant. A coolant return line 142 is fluidly coupled to the cavity 170 through the chamber lid 102. The coolant return line 142 may extend to a chiller 174 configured to cool and recirculate the coolant from the coolant return line 142 into the coolant supply 165.

In use, the magnetron assembly 196 rotates and, in some embodiments, vertically moves the rotatable magnet assembly 148 within the cavity 170. In some embodiments, the coupling assembly 178 may be a belt that includes ridges which mate with grooves disposed in the motor 176 and the feedthrough assembly 154 to transfer the rotational motion provided by the motor 176 to the rotatable magnet assembly 148. In some embodiments, the coupling assembly 178 may alternatively be coupled to the rotatable magnet assembly 148 through the use of pulleys, gears, or other suitable means of transferring the rotational motion provided by the motor 176.

The inventors have discovered that coolant supplied through a central coolant feedthrough channel is free to travel anywhere in the cavity 170. Specifically, coolant flows in a space between magnets instead of only across the back surface of the target assembly 114. As a result, the target assembly 114 can become excessively hot, leading to failure of the target assembly 114. The inventors have discovered that if a coolant guide is incorporated into the rotatable magnet assembly 148, coolant is forced to flow between a bottom face of the rotatable magnet assembly 148 and the back surface of the target assembly 114, thus improving cooling of the target assembly 114.

The substrate support 106 has a support surface facing a lower surface of a target assembly 114 and supports the substrate 108 to be sputter coated opposite to the lower surface of the target assembly 114. The substrate support 106 may support the substrate 108 in a central region 120 of the interior volume 115 of the chamber body 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through an isolation valve (not shown) in the lower portion of the chamber body 104 and thereafter raised to a deposition, or processing position. A bellows 122 connected to a bottom chamber wall 124 may be provided to maintain a separation of the interior volume 115 of the chamber body 104 from the atmosphere outside of the chamber body 104 while facilitating vertical movement of the substrate support 106. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively, or in combination, a capacitance tuner 136 may be coupled to the substrate support 106 for adjusting voltage on the substrate 108 for applications where RF bias power may not be desired.

The chamber body 104 further includes a process kit shield, or shield, 138 to surround the processing volume, or central region, of the chamber body 104 and to protect other chamber components from damage and/or contamination from processing. In some embodiments, the shield 138 may be connected to a ledge 140 of an upper grounded enclosure wall 116 of the chamber body 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in a lower, loading position but rests on the outer periphery of the substrate support 106 when in an upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the chamber body 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a desired cross-section. The seal ring 181 may include two opposing planar and generally parallel surfaces to facilitate interfacing with the target assembly 114, such as the backing plate 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD process chamber 100.

The target assembly 114 includes the source material 113 to be deposited on a substrate, such as the substrate 108 during sputtering, such as a metal, metal oxide, metal alloy, or the like. In some embodiments, the source material 113 may be titanium, tantalum, tungsten, or the like. In embodiments consistent with the present disclosure, the target assembly 114 includes a backing plate 160 to support the source material 113. The source material 113 may be disposed on a substrate support facing side of the backing plate assembly 160 as illustrated in FIG. 1. The backing plate 160 may comprise a conductive material, such as copper-zinc, copper-chrome, or the same material as the target, such that RF and DC power can be coupled to the source material 113 via the backing plate 160. Alternatively, the backing plate 160 may be non-conductive and may include conductive elements (not shown) such as electrical feedthroughs or the like. The backing plate 160 may be disc shaped, rectangular, square, or any other shape that may be accommodated by the PVD process chamber 100. The backing plate 160 is configured to support the source material 113 such that a front surface of the source material opposes the substrate 108 when present. The source material 113 may be coupled to the backing plate 160 in any suitable manner. For example, in some embodiments, the source material 113 may be diffusion bonded to the backing plate 160.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate 160 proximate the peripheral edge of the backing plate 160.

An insulative gap 180 is provided between the grounding plate 156 and the outer surfaces of the source distribution plate 158, the conductive support ring 164, and the target assembly 114. The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 10 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD process chamber 100 has an RF power source 182 connected to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD process chamber 100 may include a second energy source 189 to provide additional energy to the target assembly 114 during processing. In some embodiments, the second energy source 189 may be a DC power source to provide DC energy, for example, to enhance a sputtering rate of the target material (and hence, a deposition rate on the substrate). In some embodiments, the second energy source 189 may be a second RF power source, similar to the RF power source 182, to provide RF energy, for example, at a second frequency different than a first frequency of RF energy provided by the RF power source 182. In embodiments where the second energy source 189 is a DC power source, the second energy source may be coupled target assembly 114 in any location suitable to electrically couple the DC energy to the target assembly 114, such as the source distribution plate 158 or some other conductive member.

A controller 194 may be provided and coupled to various components of the PVD process chamber 100 to control the operation thereof. The controller 194 includes a central processing unit (CPU) 118, a memory 172, and support circuits 173. The controller 194 may control the PVD process chamber 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods may be stored in the memory 172 as software routine that may be executed or invoked to control the operation of the PVD process chamber 100 in the manner described herein. The software routine may also be stored and/or executed by a second CPU (not shown) that is remotely located from the hardware being controlled by the CPU 118.

Figure 2:
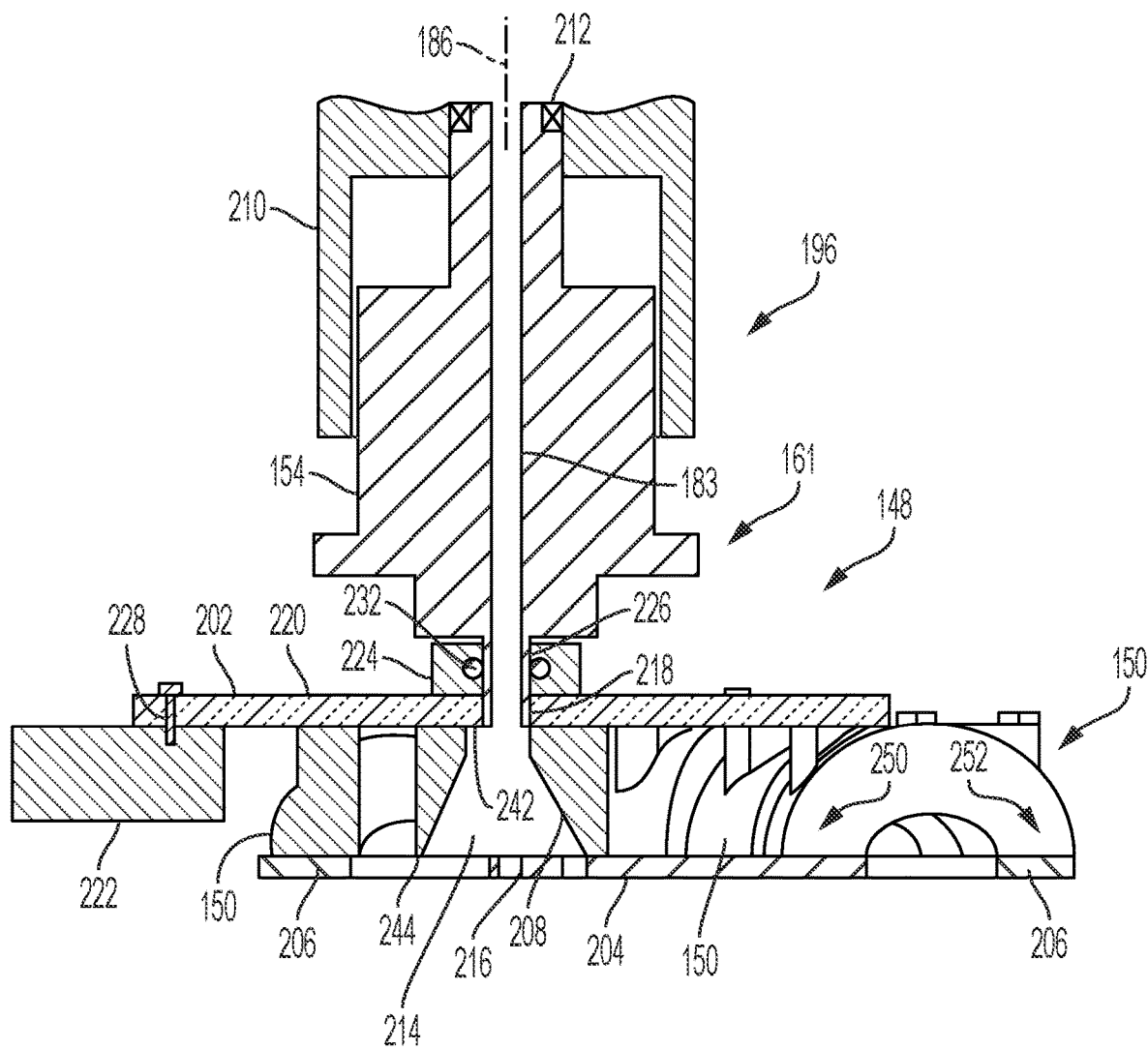
FIG. 2 depicts a cross-sectional view of a portion of a magnetron assembly in accordance with at least some embodiments of the present disclosure.

FIG. 2 depicts a cross-sectional view of a portion of a magnetron assembly 196 in accordance with at least some embodiments of the present disclosure. In some embodiments, the magnetron assembly 196 includes a housing 210 disposed about the feedthrough assembly 154. The housing 210 is generally stationary and supports the feedthrough assembly 154 that rotates within the housing 210. One or more bearings 212 may be disposed between the housing 210 and the feedthrough assembly 154 to facilitate rotational movement therebetween. In some embodiments, the lower portion 161 of the feedthrough assembly 154 is disposed outside of the housing 210. The feedthrough assembly 154 is coupled to and rotates with the rotatable magnet assembly 148.

The rotatable magnet assembly 148 includes a plurality of magnets 150 spaced apart from each other and disposed about the central axis 186 of the magnetron assembly 196. In some embodiments, the plurality of magnets 150 are coupled between an upper plate 202 and an inner plate 204, where the upper plate 202 is disposed above the inner plate 204. In some embodiments, the plurality of magnets 150 are coupled to the upper plate 202, the inner plate 204, and an outer ring 206 disposed radially outward of the inner plate 204. For example, the inner plate 204 may be coupled to a first end 250 of each of the plurality of magnets 150 and the outer ring 206 may be coupled to a second end 252 of each of the plurality of magnets 150. In some embodiments the inner plate 204 and the outer ring 206 are disposed along a common horizontal plane.

The upper plate 202 includes a coolant feed opening 218 fluidly coupled to the coolant feedthrough channel $183v$ In some embodiments, the upper plate 202 is made of a composite material such as a glass-reinforced epoxy laminate material, a plastic material such as high density polyethylene, ultra-high molecular weight polyethylene, nylon, or acrylonitrile butadiene styrene (ABS), or a metal material such as titanium, stainless steel, or a copper alloy, for example, brass. In some embodiments, the lower portion 161 of the feedthrough assembly 154 of the magnetron assembly 196 extends into the coolant feed opening 218. The inner plate 204 includes one or more coolant holes 216 extending therethrough and configured to provide a coolant flow path from the coolant feedthrough channel 183 through the one or more coolant holes 216 to an area beneath the inner plate 204.

A coolant guide 208 is disposed between the inner plate 204 and the upper plate 202 and includes a guide channel 214 advantageously aligned with the coolant feed opening 218 in the upper plate 202 and the one or more coolant holes 216 in the inner plate 204 to facilitate guiding or funneling coolant from the coolant feed opening 218 to the one or more coolant holes 216. The coolant guide 208 may have any suitable geometry to accommodate a shape of magnets of the plurality of magnets 150. For example, the coolant guide 208 may have a cross-sectional square shape, rectangular shape, round shape, oval shape, or any other suitable free-form shape provided that the guide channel 214 aligns with the one or more coolant holes 216. In some embodiments, the guide channel 214 increases in size as the guide channel 214 extends from the upper plate 202 to the inner plate 204. For example, a cross-sectional area of the guide channel 214 measured along a plane parallel to an upper surface 242 of the coolant guide 208 increases from the upper surface of the coolant guide 208 to a lower surface 244 of the coolant guide 208. In some embodiments, the coolant guide 208 is made of a similar or same material as the upper plate 202.

In some embodiments, an upper surface 220 of the upper plate 202 includes a feedthrough clamp 224 having a central opening 226 that is configured to clamp a lower portion 161 of the feedthrough assembly 154. In some embodiments, the feedthrough clamp 224 comprises two annular pieces (see FIG. 4) that are coupled together after the lower portion 161 is placed in the central opening 226. In some embodiments, one of the annular pieces of the feedthrough clamp 224 is coupled to or integrally formed with the upper plate 202. An o-ring 232 may be disposed between the feedthrough clamp 224 and the feedthrough assembly 154 to provide a seal therebetween.

In some embodiments, the plurality of magnets 150 may be offset from the central axis 186 of the magnetron assembly 196. In some embodiments, the magnetron assembly 196 includes a counterweight 222 coupled to the upper plate 202 to balance the rotatable magnet assembly 148 about the central axis 186 due to the plurality of magnets 150 that are offset. In some embodiments, the counterweight 222 is coupled to the upper plate 202 via one or more fasteners 228.

Figure 3:
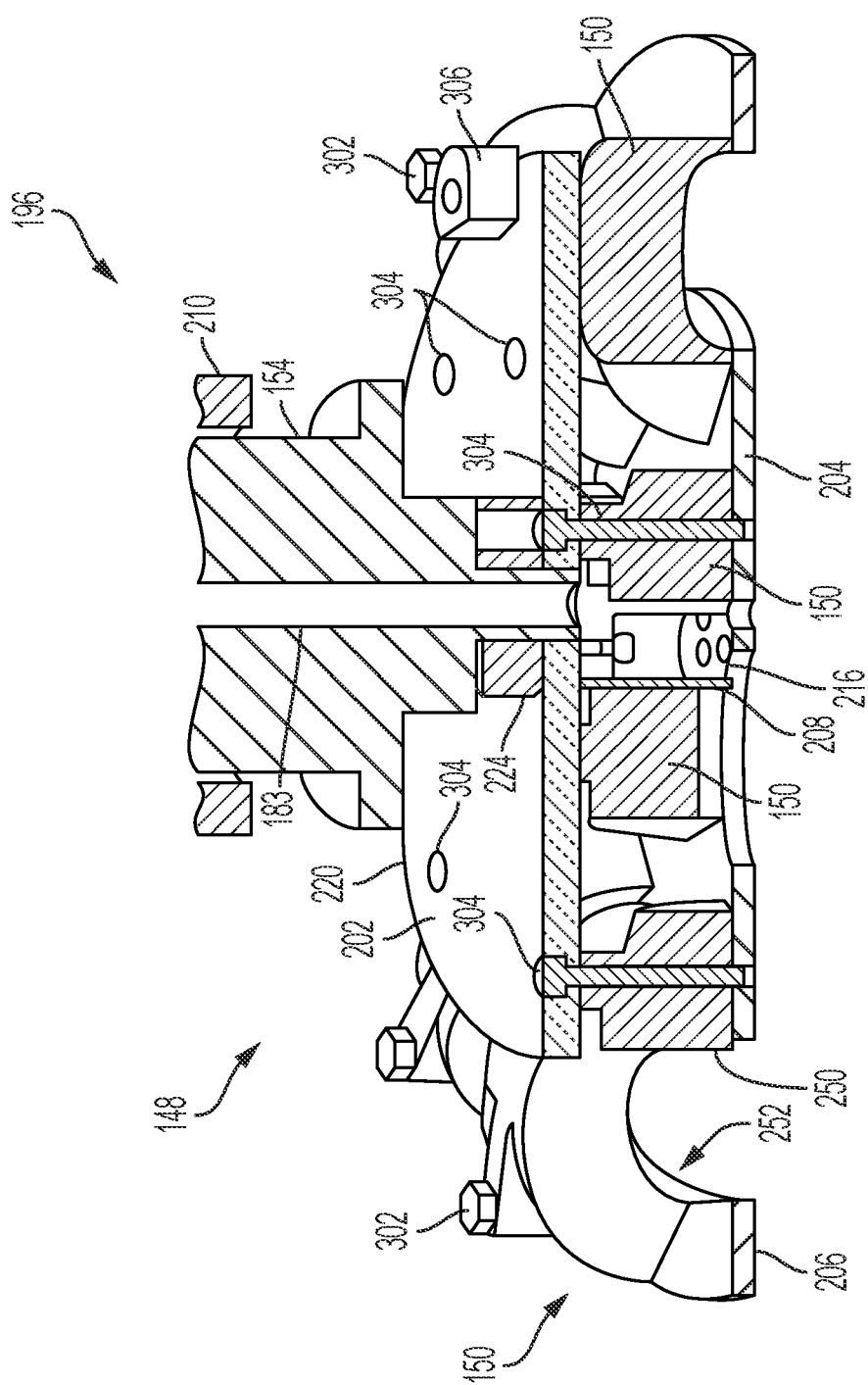
FIG. 3 depicts a cross-sectional top isometric view of a portion of a magnetron assembly in accordance with at least some embodiments of the present disclosure.

FIG. 3 depicts a cross-sectional top isometric view of a portion of a magnetron assembly 196 in accordance with at least some embodiments of the present disclosure. In some embodiments, the first end 250 of each of the plurality of magnets 150 are coupled to between the upper plate 202 and the inner plate 204 via fasteners 304. In some embodiments, as shown in FIG. 3, the fasteners 304 extend from the upper plate 202 through the first end 250 into the inner plate 204. In some embodiments, the second end 252 of each of the plurality of magnets 150 are coupled to the outer ring 206 via fasteners 302. In some embodiments, at least some of the fasteners 302 extend from an upper surface of at least some of the plurality of magnets 150 into the outer ring 206. In some embodiments, the fasteners 302 are disposed radially outward of the upper plate 202. Alternatively, one or more of the fasteners 304

In some embodiments, the rotatable magnet assembly 148 includes an indicator element 306 configured to interface with a sensing element (not shown) disposed in the chamber lid 102 to provide a speed, a position, or the like, of the rotatable magnet assembly 148 during use. In some embodiments, the indicator element 306 is coupled to the upper plate 202.

Figure 4:
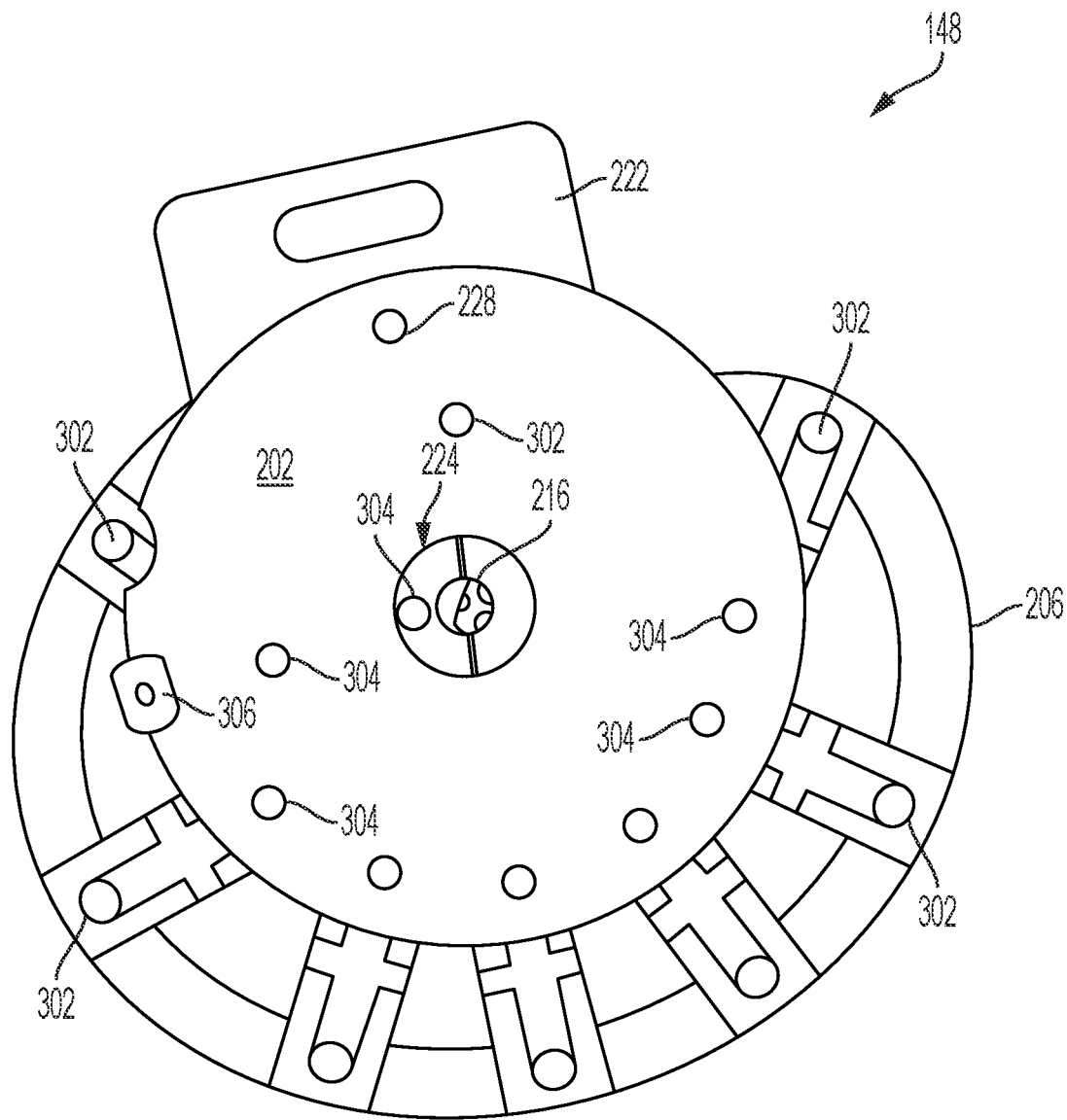
FIG. 4 depicts a top view of a rotatable magnet assembly in accordance with at least some embodiments of the present disclosure.

FIG. 4 depicts a top view of rotatable magnet assembly 148 in accordance with at least some embodiments of the present disclosure. In some embodiments, the upper plate 202 has a substantially circular shape. In some embodiments, the inner plate 204 has a non-circular shape, for example, an elongate shape. In some embodiments, at least a portion of the outer ring 206 extends radially beyond the upper plate 202. In some embodiments, at least a portion of the outer ring 206 extends radially beyond the upper plate 202 and at least a portion of the outer ring 206 is disposed radially inward of the upper plate 202. In some embodiments, one of the fasteners 304 extends through the feedthrough clamp 224, through the upper plate 202, through one magnet of the plurality of magnets 150 and into the inner plate 204. In some embodiments, one or more of the fasteners 302 that couple the second end 252 of one or more of the plurality of magnets 150 to the outer ring 206 extends through the upper plate 202, the magnet and into the outer ring 206.

Figure 5:
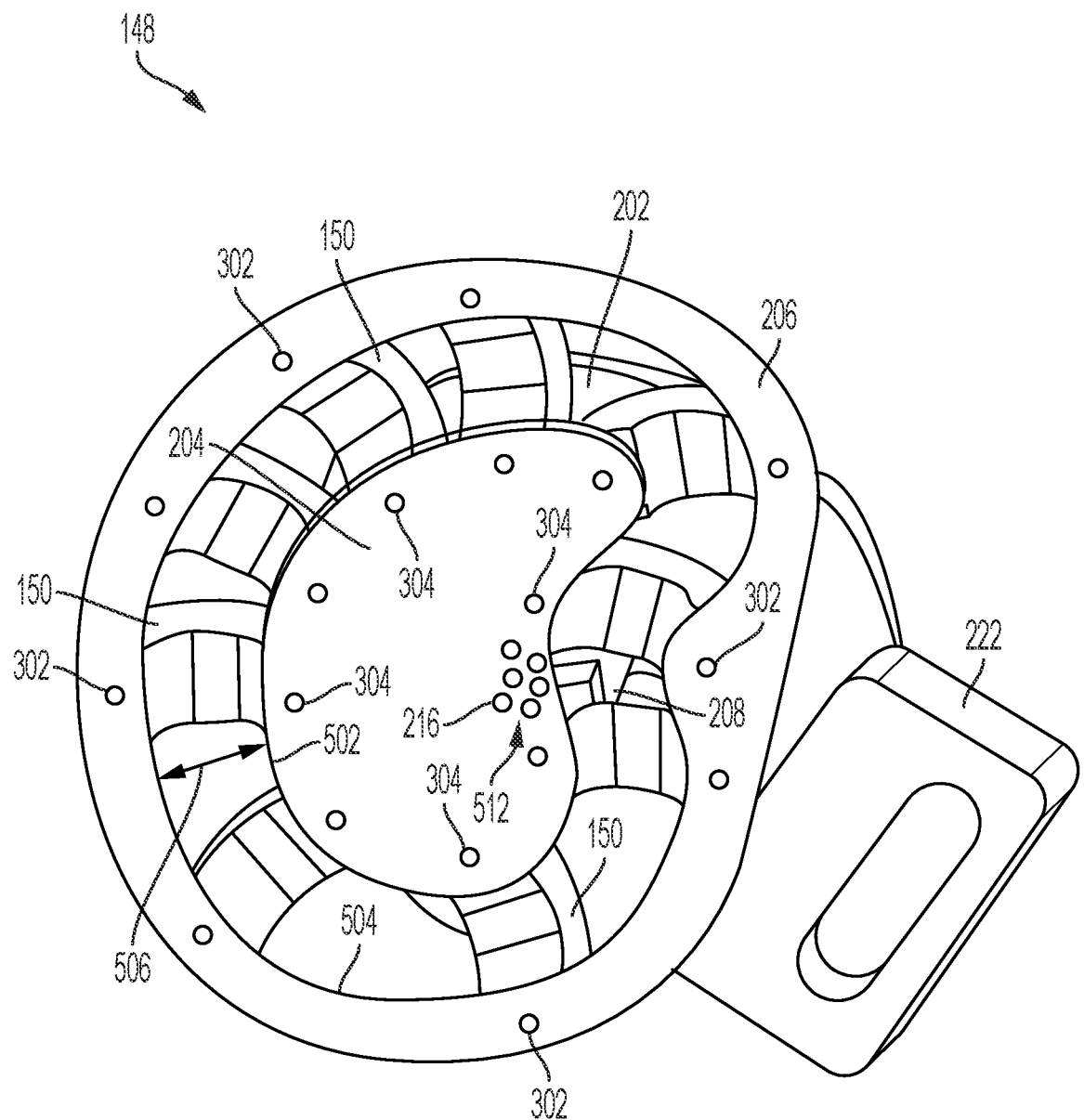
FIG. 5 depicts a bottom view of a rotatable magnet assembly in accordance with at least some embodiments of the present disclosure.

FIG. 5 depicts a bottom view of a rotatable magnet assembly 148 in accordance with at least some embodiments of the present disclosure. In some embodiments, at least some of the fasteners 304 extend from the inner plate 204 through the first end 250 into the upper plate 202. In some embodiments, the rotatable magnet assembly 148 includes a gap 506 between an outer edge 502 of the inner plate 204 and an inner edge 504 of the outer ring 206. In some embodiments, the outer edge 502 has a profile corresponding with a profile of the inner edge 504. In some embodiments, the gap 506 is substantially uniform along an entirety of the inner edge 504. In some embodiments, the one or more coolant holes 216 are disposed along a peripheral region 512 of the inner plate 204.

Figure 6:
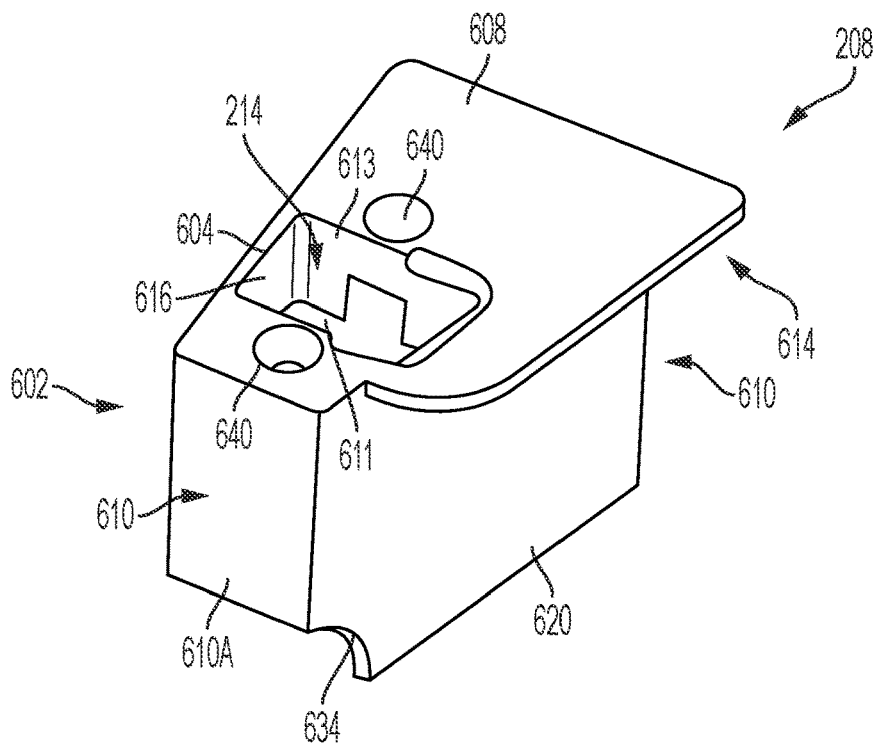
FIG. 6 depicts a top isometric view of a coolant guide in accordance with at least some embodiments of the present disclosure.
Figure 7:
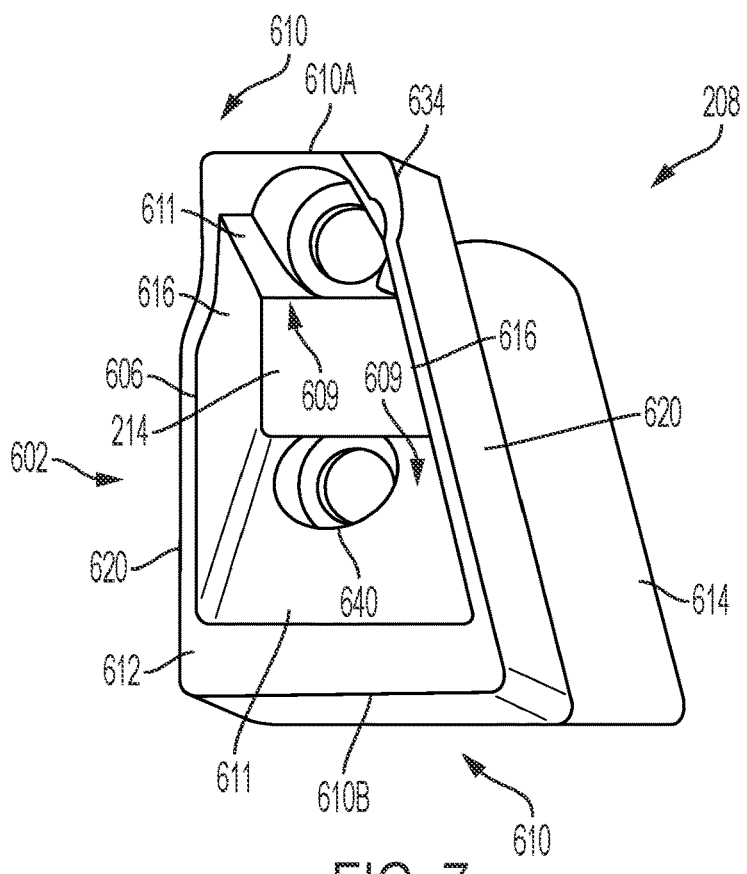
FIG. 7 depicts a bottom isometric view of a coolant guide in accordance with at least some embodiments of the present disclosure.

FIG. 6 depicts a top isometric view of a coolant guide 208 in accordance with at least some embodiments of the present disclosure. FIG. 7 depicts a bottom isometric view of a coolant guide 208 in accordance with at least some embodiments of the present disclosure. In some embodiments, the coolant guide 208 is made of a non-magnetic material. In some embodiments, the coolant guide 208 is made of a composite material such as a glass-reinforced epoxy laminate material, a plastic material such as high density polyethylene, ultra-high molecular weight polyethylene, nylon, or acrylonitrile butadiene styrene (ABS), or a metal material such as titanium, stainless steel, or a copper alloy, for example, brass. The coolant guide 208 generally includes a body 602 having the guide channel 214 extending through the body 602. An upper opening 604 of the guide channel 214 corresponding with an upper surface 608 of the body 602 has a first size and a lower opening 606 of the guide channel 214 corresponding with a lower surface 612 of the body 602 has a second size greater than the first size.

In some embodiments, the body 602 includes a first pair of outer sidewalls 610 that are substantially parallel to each other. In some embodiments, the body 602 includes a second pair of outer sidewalls 620 that are angled toward each other. The first pair of outer sidewalls 610 includes a first sidewall 610A and a second sidewall 610B opposite the first sidewall 610A. In some embodiments, the first sidewall 610A is smaller in width than the second sidewall 610B.

In some embodiments, the guide channel 214 is defined by opposing first inner sidewalls 609 that include angled portions 611 that extend away from each other. In some embodiments, the first inner sidewalls 609 include vertical portions 613 that extend substantially perpendicular from a plane parallel to the upper surface 608 of the body 602 to a location between the upper surface 608 and the lower surface 612 and angled portions 611 that extend from the vertical portions to the lower surface 612. In some embodiments, the guide channel 214 is further defined by opposing second inner sidewalls 616 that extend substantially perpendicular from the plane parallel to the upper surface 608 of the body 602 to the lower surface 612 of the body 602. In some embodiments, the upper opening 604 of the guide channel 214 includes rounded edges. In some embodiments, the upper opening 604 includes rounded edges at portions of the upper opening 604 aligned with the coolant feedthrough channel 183.

In some embodiments, the body 602 includes an upper lip 614 extending away from the upper surface 608 of the body 602. In some embodiments, the body 602 includes a cutout 634 at the lower surface 612 of the body 602. The cutout 634 may be configured to correspond with a shape of the inner plate 204. In some embodiments, the body 602 includes a plurality of fastener openings 640 that extend through the body 602 to the upper surface 608 for coupling the body 602 to other components of the magnetron assembly 196. In some embodiments, the fastener openings 640 extend from the upper surface 608 to the angled portions 611 of the first inner sidewalls 609. In some embodiments, the fastener openings 640 are disposed on opposing sides of the guide channel 214.

While the foregoing is directed to embodiments of the present disclosure, other and further embodiments of the disclosure may be devised without departing from the basic scope thereof.

The invention claimed is:

1. A coolant guide for use in a magnetron assembly, comprising:
   a body having a guide channel extending through the body, wherein an upper opening of the guide channel corresponding with an upper surface of the body has a first size and a lower opening of the guide channel corresponding with a lower surface of the body has a second size greater than the first size, and wherein the body includes a first pair of outer sidewalls that are substantially parallel to each other and a second pair of outer sidewalls that are angled toward each other; and
   an upper lip extending away from an upper surface of the body.

2. The coolant guide of claim 1, wherein the coolant guide is made of a non-magnetic material.

3. The coolant guide of claim 1, wherein the first pair of outer sidewalls includes a first sidewall and a second sidewall opposite the first sidewall, and wherein the first sidewall is smaller in width than the second sidewall.

4. The coolant guide of claim 1, wherein the guide channel is defined by opposing first inner sidewalls that include angled portions that extend away from each other.

5. The coolant guide of claim 4, wherein the guide channel is further defined by opposing second inner sidewalls that extend substantially perpendicular from a plane parallel to the upper surface of the body to the lower surface of the body.

6. The coolant guide of claim 1, wherein the body includes a plurality of fastener openings that extend through the body to the upper surface for coupling the body to other components of the magnetron assembly.

7. The coolant guide of claim 1, wherein the body includes a cutout at the lower surface of the body.

8. The coolant guide of claim 1, wherein the upper opening of the guide channel includes rounded edges.

9. A magnetron assembly, comprising:
   a plurality of magnets spaced apart from each other;
   an inner plate coupled to a first end of each of the plurality of magnets and having one or more coolant holes extending therethrough;
   an outer ring disposed about the inner plate and coupled to a second end of each of the plurality of magnets;
   an upper plate disposed above the inner plate and coupled to the inner plate and the plurality of magnets, wherein the upper plate includes a coolant feed opening; and
   a coolant guide disposed between the inner plate and the upper plate and having a guide channel aligned with the coolant feed opening and the one or more coolant holes to facilitate guiding a coolant from the coolant feed opening into the one or more coolant holes.

10. The magnetron assembly of claim 9, further comprising:
    a feedthrough assembly extending along a central axis of the magnetron assembly and having a coolant feedthrough channel to provide a coolant to the coolant feed opening, wherein the upper plate is coupled to a bottom of the feedthrough assembly.

11. The magnetron assembly of claim 10, further comprising a housing disposed about the feedthrough assembly, wherein the feedthrough assembly is configured to rotate within the housing.

12. The magnetron assembly of claim 9, further comprising a counterweight coupled to the upper plate.

13. The magnetron assembly of claim 9, wherein the upper plate and the coolant guide comprise a copper alloy.

14. The magnetron assembly of claim 9, wherein the outer ring extends radially beyond the upper plate.

15. A process chamber, comprising:
    a chamber body having an interior volume therein;
    a chamber lid removably disposed atop the chamber body;
    a target assembly comprising a material to be sputtered coupled to the chamber lid, wherein the target assembly and the chamber lid define a cavity therebetween;
    a substrate support disposed within the chamber body opposite the target assembly to support a substrate; and
    a magnetron assembly disposed on a side of the target assembly opposite the substrate support comprising:
       a rotatable magnet assembly having a plurality of magnets spaced apart from each other and disposed about a central axis of the magnetron assembly, wherein the plurality of magnets are coupled to an upper plate, an inner plate, and an outer ring; and
       a coolant guide disposed between the inner plate and the upper plate radially inward of the plurality of magnets and having a guide channel aligned with a coolant feed opening in the upper plate and one or more coolant holes in the inner plate to facilitate guiding a coolant from the coolant feed opening to the one or more coolant holes.

16. The process chamber of claim 15, wherein the magnetron assembly further comprises:
    a feedthrough assembly coupled to the rotatable magnet assembly and having a coolant feedthrough channel configured to flow a coolant to an area below the inner plate via the coolant feed opening in the upper plate, the coolant guide, and the one or more coolant holes in the inner plate.

17. The process chamber of claim 16, wherein an upper surface of the upper plate includes a feedthrough clamp having a central opening that is configured to clamp a bottom of the feedthrough assembly.

18. The process chamber of claim 17, further comprising a coolant return line fluidly coupled to the cavity through the chamber lid and into a chiller configured to cool and recirculate the coolant through the process chamber.

19. The process chamber of claim 16, further comprising a coolant supply coupled to the coolant feedthrough channel of the feedthrough assembly.

20. The process chamber of claim 15, wherein a cross-sectional area of the guide channel measured along a plane parallel to an upper surface of the coolant guide increases from the upper surface of the coolant guide to a lower surface of the coolant guide.

* * * * *